US008117490B2

(12) United States Patent
Haller

(10) Patent No.: US 8,117,490 B2
(45) Date of Patent: Feb. 14, 2012

(54) MICROPROCESSOR MEMORY MANAGEMENT

(75) Inventor: Mark Haller, Cirencester (GB)

(73) Assignee: Kelsey-Hayes Company, Livonia, MI (US)

( * ) Notice: Subject to any disclaimer, the term of this patent is extended or adjusted under 35 U.S.C. 154(b) by 143 days.

(21) Appl. No.: 12/085,732

(22) PCT Filed: Nov. 30, 2006

(86) PCT No.: PCT/US2006/045820
§ 371 (c)(1),
(2), (4) Date: Jan. 26, 2009

(87) PCT Pub. No.: WO2007/064781
PCT Pub. Date: Jun. 7, 2007

(65) Prior Publication Data
US 2009/0164838 A1    Jun. 25, 2009

(51) Int. Cl.
*G06F 11/00* (2006.01)
(52) U.S. Cl. .......... 714/6.11; 714/718; 711/173
(58) Field of Classification Search ........ 714/8, 6, 714/6.11
See application file for complete search history.

(56) References Cited

U.S. PATENT DOCUMENTS

| | | | | |
|---|---|---|---|---|
| 4,270,168 A | * | 5/1981 | Murphy et al. | 714/10 |
| 4,493,303 A | | 1/1985 | Thompson et al. | |
| 4,685,056 A | * | 8/1987 | Barnsdale et al. | 711/164 |
| 4,855,901 A | | 8/1989 | Planteline | |
| 5,005,089 A | * | 4/1991 | Thanos et al. | 360/77.08 |
| 5,406,483 A | * | 4/1995 | Kallis et al. | 701/53 |
| 5,581,464 A | * | 12/1996 | Woll et al. | 701/35 |
| 5,689,635 A | | 11/1997 | Petrosino | |
| 5,703,888 A | * | 12/1997 | Matsumoto et al. | 714/805 |
| 5,712,822 A | | 1/1998 | Petrosino | |
| 5,713,643 A | * | 2/1998 | Esselbrugge et al. | 303/122.08 |
| 5,748,882 A | * | 5/1998 | Huang | 714/47 |
| 5,751,641 A | | 5/1998 | Petrosino | |
| 5,793,942 A | * | 8/1998 | Shoji | 714/5 |
| 5,862,502 A | * | 1/1999 | Giers | 701/71 |
| 5,983,307 A | | 11/1999 | Abily et al. | |
| 6,108,742 A | | 8/2000 | Jeong | |
| 6,167,338 A | * | 12/2000 | De Wille et al. | 701/51 |
| 6,299,261 B1 | * | 10/2001 | Weiberle et al. | 303/20 |

(Continued)

FOREIGN PATENT DOCUMENTS

JP        60091401       5/1985

OTHER PUBLICATIONS

Supplemental European Search Report to Application No. EP 06 83 8668 dated Nov. 18, 2009.

*Primary Examiner* — Scott Baderman
*Assistant Examiner* — Chae Ko
(74) *Attorney, Agent, or Firm* — MacMillan, Sobanski & Todd, LLC

(57) ABSTRACT

A memory for an electronic brake control system is divided into portions that are classified as critical and non-critical. Each portion is periodically tested for faults. Upon detection of a fault, the memory is reconfigured with any operations of the brake system associated with a critical memory portion permanently disabled and any operations of the brake system associated with a non-critical memory portion temporarily disabled.

16 Claims, 11 Drawing Sheets

U.S. PATENT DOCUMENTS

| | | | |
|---|---|---|---|
| 6,473,856 B1* | 10/2002 | Goodwin et al. | 713/2 |
| 6,728,910 B1 | 4/2004 | Huang | |
| 6,912,166 B2 | 6/2005 | Kawai et al. | |
| 6,922,799 B2 | 7/2005 | Koike | |
| 6,930,937 B2 | 8/2005 | Lay | |
| 6,968,483 B2 | 11/2005 | Hartmann | |
| 2002/0029313 A1* | 3/2002 | Funakoshi | 711/102 |
| 2002/0056056 A1* | 5/2002 | Bannatyne et al. | 714/25 |
| 2002/0196685 A1* | 12/2002 | Topham | 365/200 |
| 2003/0041217 A1 | 2/2003 | Terada et al. | |
| 2003/0135790 A1* | 7/2003 | Pignol | 714/38 |
| 2003/0140271 A1* | 7/2003 | Wynn et al. | 714/8 |
| 2004/0049324 A1* | 3/2004 | Walker | 701/1 |
| 2004/0068679 A1* | 4/2004 | Vellolil et al. | 714/42 |
| 2004/0092255 A1 | 5/2004 | Ji et al. | |
| 2004/0199825 A1 | 10/2004 | Zeller et al. | |
| 2004/0268106 A1 | 12/2004 | Holmberg et al. | |
| 2005/0076266 A1* | 4/2005 | Costin | 714/38 |
| 2005/0190615 A1 | 9/2005 | Linde et al. | |
| 2005/0251728 A1 | 11/2005 | Stocken | |
| 2006/0053235 A1* | 3/2006 | Terada et al. | 710/16 |
| 2006/0089954 A1* | 4/2006 | Anschutz | 707/202 |
| 2006/0143431 A1* | 6/2006 | Rothman et al. | 713/2 |
| 2006/0200276 A1* | 9/2006 | Sayama et al. | 701/1 |
| 2007/0036036 A1* | 2/2007 | Kadish et al. | 368/230 |

* cited by examiner

MICROPROCESSOR MEMORY MANAGEMENT

BACKGROUND OF THE INVENTION

This invention relates in general to vehicle electronic control systems and in particular to a method for reconfiguring a microprocessor memory device in a vehicle electronic brake control system upon detecting a fault in a portion of the memory device.

Many vehicles being currently produced by automotive manufacturers include electronic brake control systems that are integrated with their hydraulic brake systems. Such systems include anti-lock brake systems that prevent wheel lock-up during braking cycles, traction control systems to prevent slippage of driven wheels on low mu surfaces, rear brake boost systems that selectively increase the pressure applied to the vehicle rear wheel brakes and anti-roll control systems that provide roll over avoidance. Additionally, such systems also may assist in preventing loss of directional control when the vehicle is operated upon normal or even high mu surfaces, as can occur during accident avoidance maneuvers. All of the above functions may be incorporated as operating modes in a single electronic brake control system.

An electronic brake control system typically includes an electro-hydraulic control-unit that is integrated with the brake lines of the hydraulic brake system. The electro-hydraulic control unit typically includes an electronic control unit that is mounted upon a hydraulic valve body. The electronic control unit includes a microprocessor and control algorithm for operating the brake system. The algorithm and operating parameters for the vehicle are stored in a memory device that is electrically connected to the microprocessor. The memory device may be an integral part of the microprocessor or it may be separate therefrom. Additionally, the microprocessor is connected to and receives signals from vehicle operating parameter sensors, such as, for example, wheel speed sensors, vehicle motion sensors, a steering angle sensor and a throttle position sensor.

The hydraulic valve body includes a plurality of ports that are connected through hydraulic brake lines to components of the vehicle hydraulic brake system. A plurality of normally open and normally closed solenoid valves are disposed within the hydraulic valve body. The electronic control unit is connected to the solenoid valves and operative to selectively actuate the valves. A pump also is typically mounted upon the hydraulic valve body and is operative to supply pressurized brake fluid to the brake control system. The pump is controlled by the electronic control unit microprocessor.

During vehicle operation, the electronic control unit microprocessor continuously receives signals from the various vehicle operating parameter sensors. When the microprocessor senses an impending vehicle control problem, the brake control system is activated. The microprocessor starts the pump to supply pressurized brake fluid and selectively actuates the solenoid valves to apply and relieve hydraulic pressure to the wheel brakes to correct the vehicle control problem.

Such electronic brake control systems typically include self-test algorithms to detect potential component failure. Among the components tested is the memory device that would be periodically tested to assure that it is properly functioning. Upon detecting a fault, the entire brake control system is disabled to assure safe operation of the vehicle. However, as explained above, electronic brake control systems typically include a plurality of operating modes. Therefore, upon a detecting a potential memory device fault, all of the brake system operating modes would be disabled. However, the fault may not be significant enough to justify disabling all of the operating modes. Accordingly, it would be desirable to provide a memory test method that would not necessarily disable the entire electronic brake control system upon detecting a potential memory device fault.

BRIEF SUMMARY OF THE INVENTION

This invention relates to a method for reconfiguring a microprocessor memory device in a vehicle electronic brake control system upon detecting a fault in a portion of the memory device.

The invention contemplates a method for reconfiguring a memory device that includes providing a memory that is divided into separate portions with each memory portion assigned a classification of either critical or non-critical and then testing each memory portion for a fault. Any memory portion associated with a fault is then disabled while the other memory portions are allowed to continue to operate. Additionally, the brake system operating mode associated with the faulted memory portion also is disabled. The method also contemplates that the disablement is permanent for any disabled memory portion that is classified as critical and temporary for any disabled memory portion that is classified as non-critical.

The invention also contemplates an alternate embodiment in which each portion of the memory that is assigned a critical classification is provided with a back-up memory portion provided for each critical memory portion. The alternate embodiment contemplates that, upon detection of a fault in a critical memory portion, the faulted critical memory portion is not disabled, but that the function held within the faulted memory portion is replaced, in full or in part, with the corresponding back-up memory portion, thus allowing continued operation of the portion of the system associated with the memory portion. The invention contemplates that the back-up memory may be either a complete or a partial copy of the corresponding critical memory portion with any partial copy being sufficient to allow continued operation of the associated system.

Various objects and advantages of this invention will become apparent to those skilled in the art from the following detailed description of the preferred embodiment, when read in light of the accompanying drawings.

DETAILED DESCRIPTION OF THE PREFERRED EMBODIMENT

Figure 1:
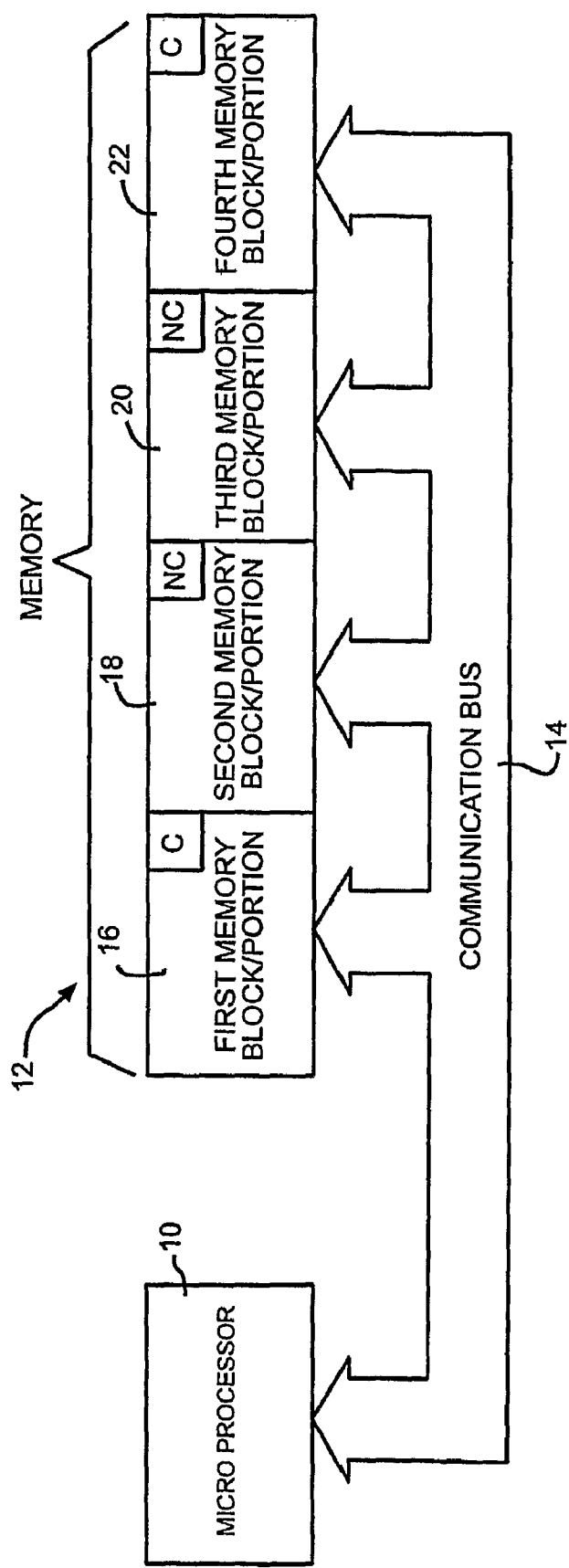
FIG. 1 is a schematic drawing of a microprocessor and an associated memory that has been divided in accordance with the invention.

Referring now to the drawings, there is illustrated in FIG. 1 a typical microprocessor 10 that is utilized to control a vehicle electronic brake control system. The microprocessor 10 is connected to a memory storage device 12 by a communications bus 14. While a separate memory storage device 12 is shown in FIG. 1, it will be appreciated that the invention also may be practiced upon other memory configurations, such as, for example, memory storage that is formed integrally with the microprocessor (not shown). Similarly, while a communication bus 14 is shown in FIG. 1, communication between the microprocessor 10 and the memory storage device 12 also may be established with any other conventional microprocessor/memory interface.

As shown in FIG. 1, the memory device is divided into a plurality of memory blocks, or portions. For clarity, only four memory portions, that are labeled 16, 18, 20 and 22, are shown in FIG. 1; however, it will be appreciated that the invention may be practiced with more or less memory portions than are illustrated in FIG. 1. The present invention contemplates that the memory portions are directly related to functions preformed by the brake control system under control of the microprocessor 10. Thus, for example, the first memory portion 16 may store coefficients and parameters needed to operate the brake control system in anti-lock braking mode while the second memory portion 18 may store coefficients and parameters needed to operate the brake control system in a traction control mode. Similarly, the third memory portion 20 may store coefficients and parameters needed to operate the brake control system in rear brake boost mode while the fourth memory portion 22 may store coefficients and parameters needed to operate the brake control system in an anti-roll control mode. The memory portions also may store all or part of the algorithms utilized by the microprocessor 10 for control of the available brake system operating modes.

The present invention also contemplates that each of the memory portions is assigned a classification as "critical" or "non-critical" for operation of the brake control system. A critical memory portion would be associated with a mode of operation that would require permanent disablement of the mode upon detection of a potential failure of the memory portion. The permanent disablement of a critical memory portion would remain in effect until the system can be serviced. A non-critical memory portion would be associated with a mode of operation that would require temporary disablement of the mode upon detection of a potential failure of the memory portion. A temporary disablement may be reset upon determination that the fault has been cleared without the system being serviced. A block in the upper right hand corner of each of the memory portions shown in FIG. 1 carries the assigned classification for the portion with the letter "C" representing a critical classification and the letters "NC" representing a non-critical classification. Thus, as illustrated in FIG. 1, the memory portions 16 and 22 associated with the anti-lock braking and anti-roll control modes of operation are classified as critical while the memory portions 18 and 20 associated with the traction control and rear brake boost modes of operation are classified as non-critical. It will be appreciated that, upon a memory portion being disabled, the brake system operating mode associated with the disabled operating mode also will be disabled and will remain disabled until the memory portion is returned to service. It also will be appreciated that the above classification is intended to exemplify a method of memory classification and that the invention also may be practiced with the particular memory portions classified other than as described.

The present invention also contemplates a method for periodically testing each portion 16, 18, 20 and 22 of the memory 12. The method is illustrated by the flow chart shown in FIG. 2. The flow chart is entered through block 30 and proceeds to functional block 32 where an index N associated with each memory portion is initially set to 1 for the first portion of the memory 12. The method continues to functional block 34 where the first portion of the memory 12, which corresponds to the portion labeled 16 in FIG. 1, is selected for testing. The method then reads the memory portion classification associated with the selected memory portion in functional block 36, which, for the example shown in FIG. 1, would be "C" for the critical portion 16 of the memory 12 associated with the anti-lock brake operational mode. Continuing to functional block 38, the selected memory portion is tested for proper operation. A conventional memory test is utilized for the test and a fault flag is set if the test is unsuccessful. The invention contemplates that either a single test may trigger setting of a fault flag or, alternately, that the memory portion would be required to fail the test for a predetermined number of successive iterations of the brake control system before a fault flag would be set. The later repetitive test is intended to preclude a false setting of a fault flag due to an extraneous occurrence, such as, for example, a temporary voltage spike in the vehicle power supply. After the test is completed, the method advances to decision block 40.

In decision block 40, it is determined whether or not a fault flag has been set in functional block 38 for the memory portion being tested. If a fault flag has not been set, the method transfers to functional block 42 where the index N is incrementally increased by one in preparation for testing the next portion of the memory 12. Thus, for the present example, the index N would be increased from 1 to 2 for testing of the second memory portion 18. If, in decision block 40, it is determined that a fault flag has been set in functional block 38, the method transfers to decision block 44.

In decision block 44, it is determined whether or not a critical portion of the memory 12 was tested in functional block 38 by checking the memory classification read in functional block 36. For the current example, the memory portion 16 is classified as critical. Accordingly, the method would transfer to functional block 46 where the operating mode of the brake system associated with the first memory block 16 would be permanently disabled, that is, the anti-lock brake mode of operation would be made inoperable until the brake system is serviced. The method would then advance to functional block 48 where, because the affected mode of operation is critical, the vehicle operator would be signaled that the operating mode is disabled. In the preferred embodiment, the signal would consist of illumination of a warning light that would remain illuminated when the vehicle ignition is on until the brake system has been serviced. The warning may either identify the affected mode of operation or be a generic "SERVICE BRAKE SYSTEM NOW" message. The method then continues to functional block 42 where the index N is incrementally increased by 1.

If, in decision block 44, it is determined that a non-critical portion of the memory 12 was tested in functional block 38, such as, for example, the second memory portion 18 associated with the traction control mode of operation, the method transfers to functional block 50. In functional block 50, the operating mode of the brake system associated with the non-critical portion of the memory is temporarily disabled. A temporary disablement allows for a clearance of the memory fault upon successive testing of the memory portion with a resetting of the fault flag for the associated non-critical memory portion. Upon clearance of the memory fault, the associated operating mode of the brake system also would be enabled. The method then advances to functional block 52 where the vehicle operator would be signaled that the mode is disabled. In the preferred embodiment, the signal would consist of illumination of a warning light that would remain illuminated when the vehicle ignition is on until the detected fault in the affected memory portion has been cleared. As shown in functional block 52, provision of the message may be optional. The invention also contemplates that repeated detection of faults for a non-critical memory portion after the fault has been cleared may result in a permanent disablement of the memory portion (not shown). The method then continues to functional block 42 where the index N is incrementally increased by 1.

Following the incremental increase of the index N the method continues to decision block 54 where it is determined whether or not the method should continue. A simple test is used in decision block 54, such as, for example, whether the vehicle ignition is on or whether the vehicle engine is running. If, in decision block 54, it is not desired to continue, the method exits through block 56. If, in decision block 54, it is desired to continue, the method transfers to decision block 58.

In decision block 58, it is determined whether or not all of the portions of the memory 12 have been tested by comparing the current value of the index N to a maximum index $N_{MAX}$. For the memory example illustrated in FIG. 1, $N_{MAX}$ would be equal to four for the four memory portions 16, 18, 20, and 22 shown in the figure. If, in decision block 58, it is determined that the all of the memory portions have not been tested, the method transfers to functional block 34 where the next memory portion is selected for testing. Thus, for the example described above, the second memory portion 18 that is associated with the traction control mode of operation would be selected in functional block 34. The method would then continue as described above. If, in decision block 58, it is determined that the all of the memory portions have been tested, the method transfers to functional block 32 where the index is reset to 1. The method would then advance to functional block 34 where the first memory portion would again be selected for testing. The method would then continue as described above. Thus, the invention contemplates a continuous testing of the memory device portions for faults. In the preferred embodiment, the memory fault testing rate is a function of the microprocessor iteration rate.

Thus, the segmentation of the memory 12 described above allows for a gradual degradation of the memory upon detection of memory faults. This allows continued operation of the non-affected portions of the brake system and provides an improvement over prior art testing systems where the entire electronic brake control system would be disabled upon detection of a single fault, regardless of the criticality of the affected system portion. While the preferred embodiment of the invention has been illustrated and described with the memory segmented into portions associated with modes of brake system operation, it will be appreciated that the invention also may be practiced with the memory segmented with regard to whether the data in the segment must always be both present and valid. Such segments would be classified as critical while the memory segments for data that would not always need to be present and/or valid would be classified as non-critical. Additionally, the fault testing of a failed memory portion may either continue at a normal rate or be accelerated to be tested at a faster rate.

Figure 2:
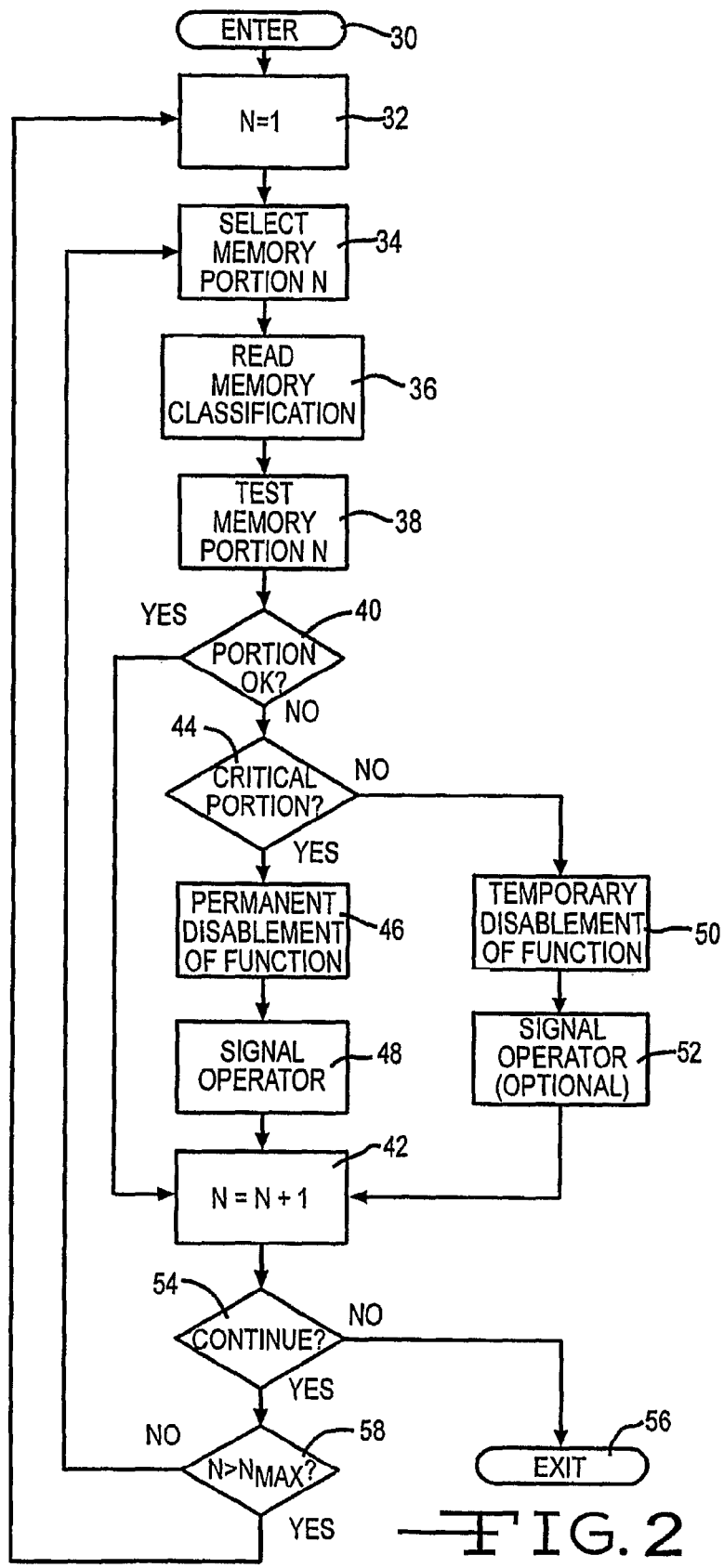
FIG. 2 is a flow chart of a method for testing the microprocessor memory shown in FIG. 1 that is in accordance with the invention.
Figure 3:
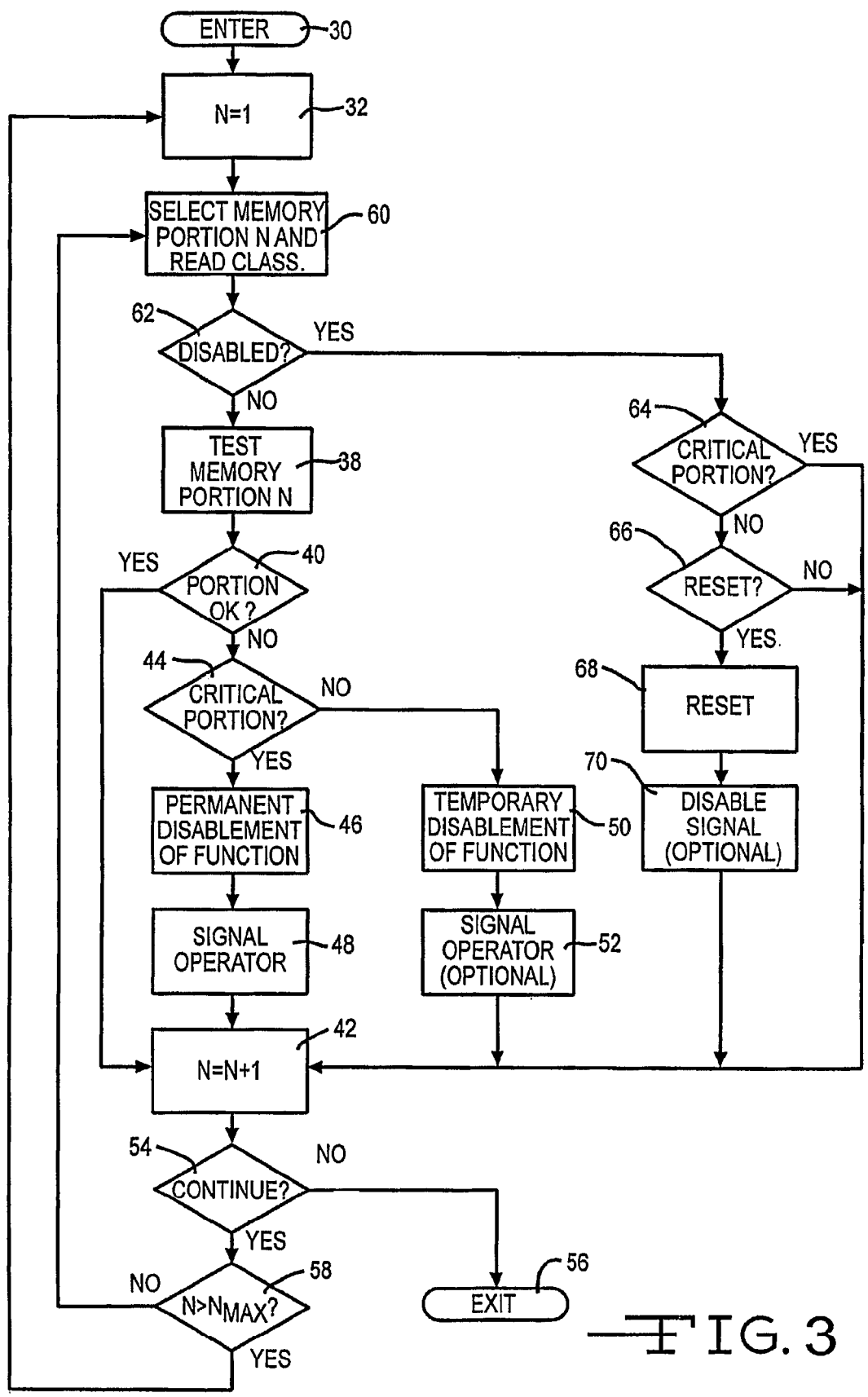
FIG. 3 is a flow chart of an alternate embodiment of the method illustrated in FIG. 2.

The present invention also contemplates an alternate embodiment of the method that is illustrated by the flow chart shown in FIG. 3 that includes a reset function. Blocks shown in FIG. 3 that are similar to blocks shown in FIG. 2 have the same numerical identifiers. Thus, the method enters through block 30 and continues to block 32 where the index N is initially set to 1. The method then advances to functional block 60 where the memory portion associated with the current index is selected for testing the classification for the selected memory portion is read. Thus, functional block 60 in FIG. 3 combines the two functional blocks labeled 34 and 36 in FIG. 2. From functional block 60, the alternate embodiment continues to decision block 62.

In decision block 62, it is determined whether or not the selected memory portion has been disabled. If the selected memory portion has not been disabled, the method transfers to functional block 38 to test the memory portion. The method then continues as described above. However, if, in decision block 62, it is determined that the selected memory portion has been disabled, the method transfers to decision block 64 where it is determined whether or not a critical portion of the memory 12 is disabled by checking the memory classification read in functional block 60. If the disabled memory portion is a critical portion, the disablement is permanent and the method transfers to functional block 42 where the index N is incrementally increased by 1. The method then continues as described above.

If, in decision block 64, it is determined that the disabled memory portion is a non-critical portion, the method transfers to decision block 66 where it is determined whether or not the disabled memory portion should be reset. The determination in decision block 66 is a function of the selected memory portion and utilizes a conventional methodology. For example, if a new fault has not been detected during a subsequent number of tests of the disabled memory portion, it may be decided that the memory portion may be reset and returned to service. If it is determined that the fault has been cleared, the method transfers to functional block 68 where the fault is cleared and the fault flag is reset. Additionally, the operating mode of the brake system associated with the cleared memory portion also is enabled. The method then advances to functional block 70 where the disable signal, if present, is extinguished. The method continues to functional block 42 and continues as described above. However, if, in decision block 66, it is determined that the fault in the disabled memory portion has not been cleared, the method transfers directly to functional block 42 and continues as described above.

Figure 4:
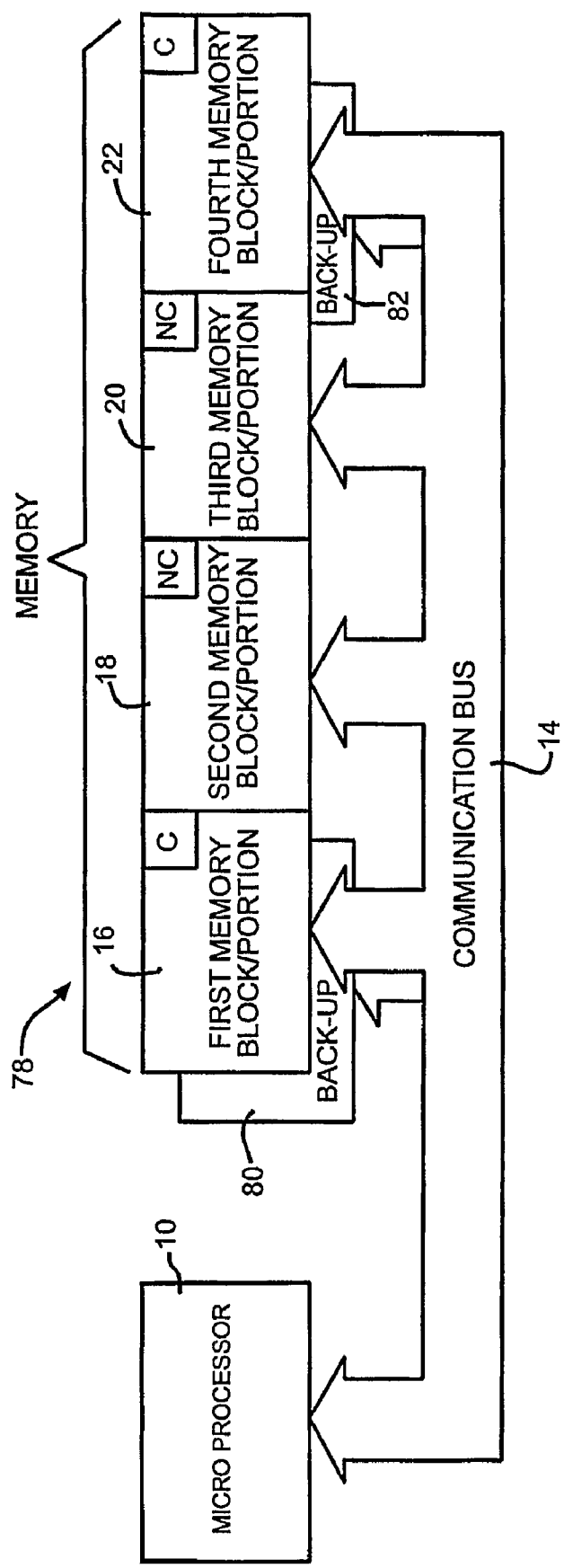
FIG. 4 is a schematic drawing of an alternate embodiment of the microprocessor memory shown in FIG. 1.

The invention also contemplates another alternate embodiment that allows continued operation of the modes associated with the critical portions of the memory. The alternate embodiment provides a back-up copy of each critical portion of the microprocessor memory as illustrated in FIG. 4, where components that are the same as components shown in FIG. 1 have the same numerical identifiers. As shown in FIG. 4, the microprocessor 10 is connected to a memory 78 having a back-up memory portion for each of the critical memory portions. Thus, for the example memory 78 shown in FIG. 4, the first memory portion 16, which is classified as critical, has a back-up memory portion 80 while the fourth memory portion 22, which also is classified as critical, has a back-up memory portion 82. The back-up memory portions 80 and 82 are connected to the microprocessor 10 by the communication bus 14 and the microprocessor, as will be described below, may selectively access the back-up memory portions.

The back-up memory portions 80 and 82 may be either complete or partial copies of their corresponding primary memory portions 16 and 18; however, the invention contemplates that the back-up memory portions contain enough information to allow the associated brake system mode of operation to continue to operate.

Figure 5:
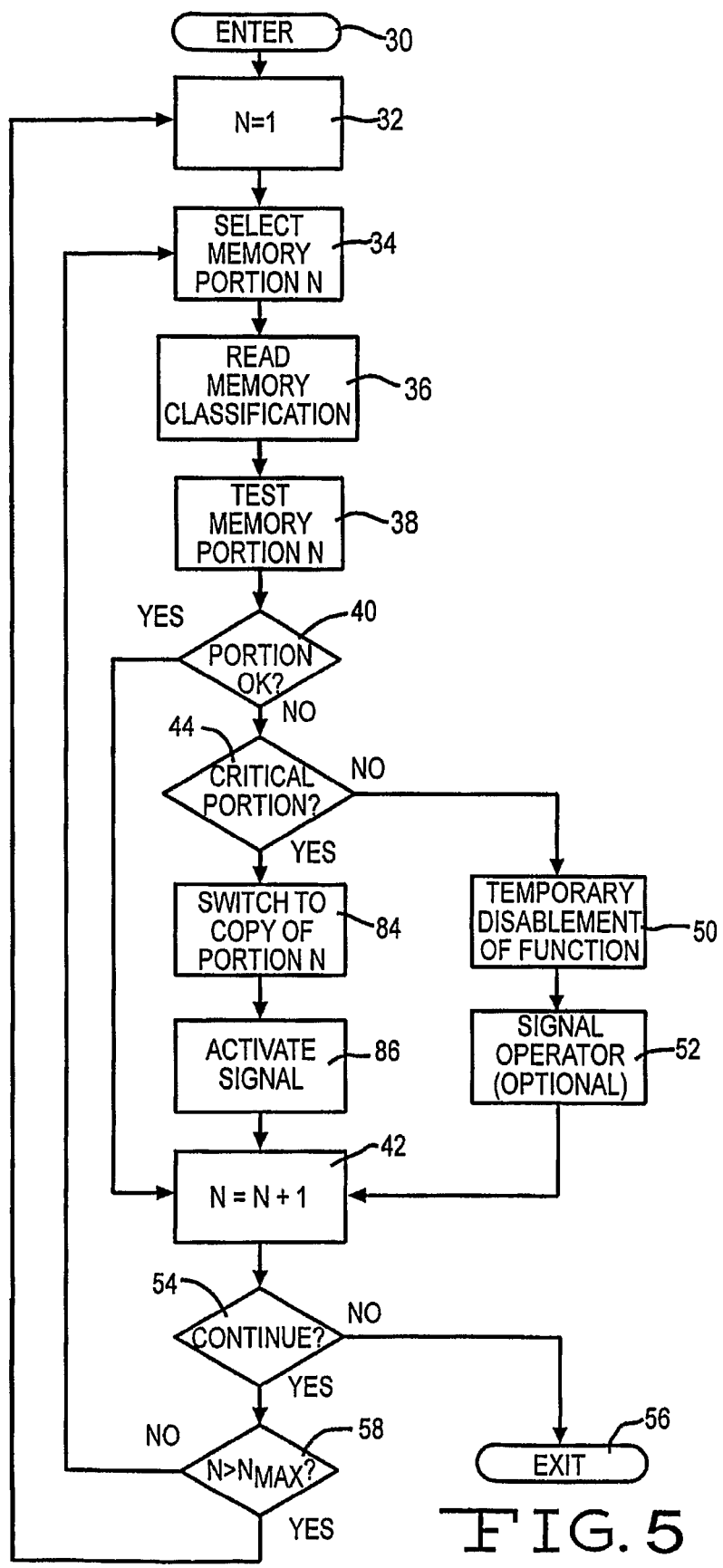
FIG. 5 is an alternate embodiment of the flow chart shown in FIG. 2.

The alternate embodiment of the invention also contemplates a method for periodically testing each portion 16, 18, 20 and 22 of the memory 12 as illustrated by the flow chart shown in FIG. 5, where the blocks that are similar to the blocks shown in FIG. 2 have the same numerical identifiers. The method proceeds as described above until it is determined that a fault has been detected in a critical memory portion in decision block 44. Upon detection of such a fault, the method transfers to functional block 84 where the back-up copy of the critical memory portion is selected for use by the microprocessor in place of the corresponding faulted critical memory portion. As a result, the microprocessor may continue to operate the portion of the brake system that is associated with the faulted memory portion. The method continues to functional block 86 where a signal indicating that a fault has been detected in a critical memory portion is set. The signal may consist of either a visual signal to alert the vehicle operator and/or the setting of a code for reading by a maintenance person during servicing. The method then continues as described above.

Figure 6:
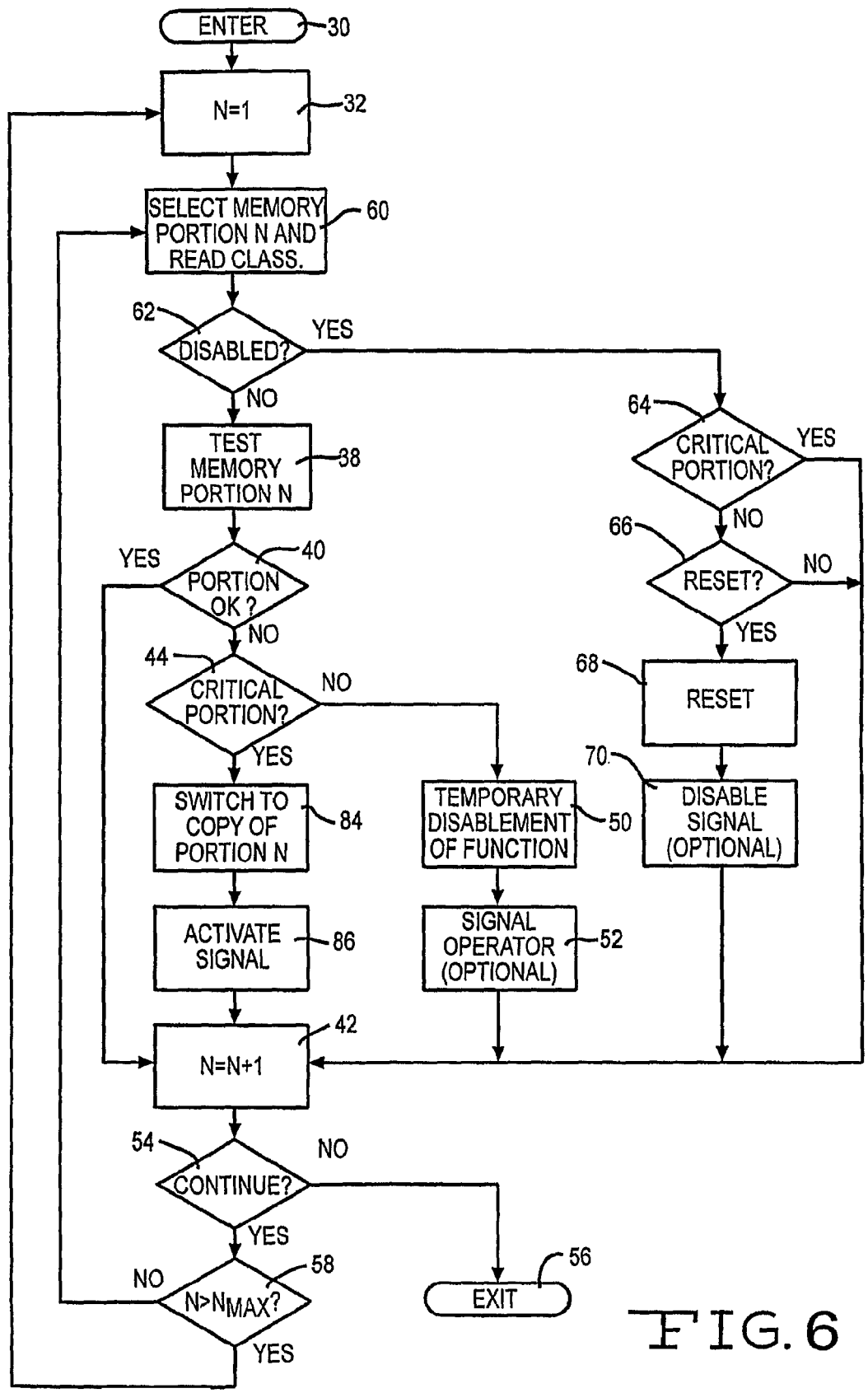
FIG. 6 is an alternate embodiment of the flow chart shown in FIG. 3.

The alternate embodiment also contemplates resetting of non-critical functions as illustrated by the flow chart shown in FIG. 6 where the blocks that are similar to the blocks shown in FIGS. 3 and 5 have the same numerical identifiers. Thus, the alternate method illustrated in FIG. 6 operates in much the same manner as described above for the method shown in FIG. 3 except that a back-up memory portion is substituted for a faulted critical memory portion in block 84 and a signal of the substitution is provided in functional block 86.

Figure 7:
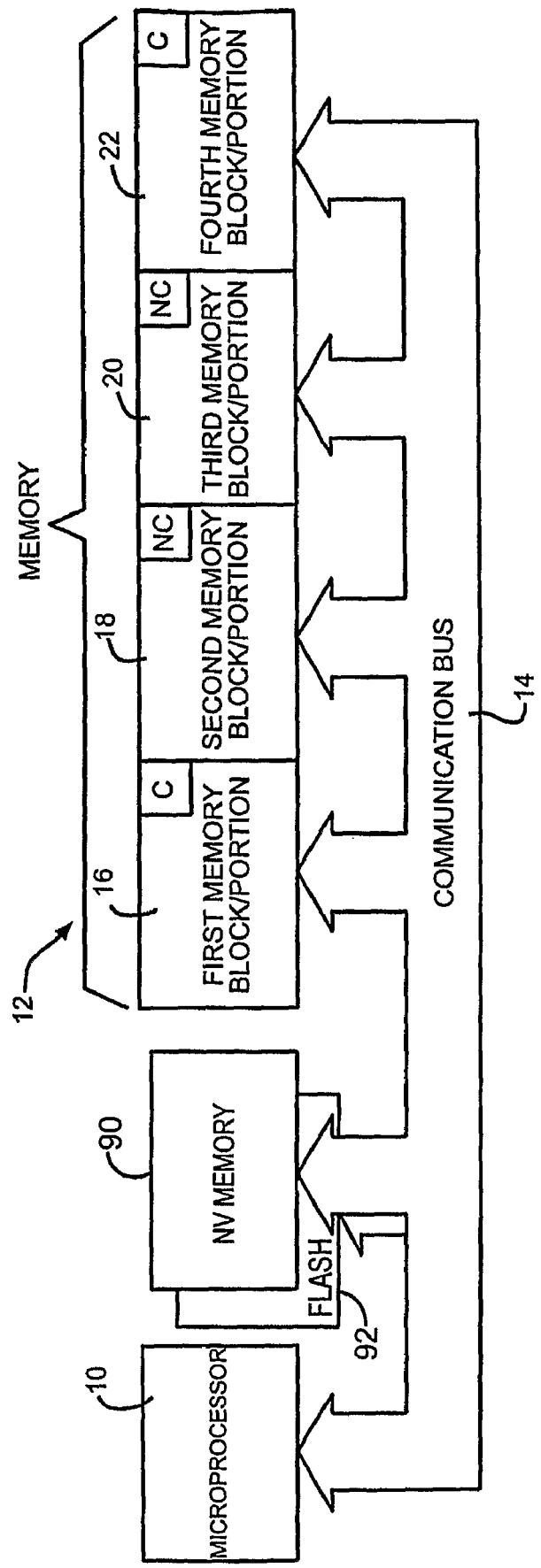
FIG. 7 is a schematic drawing of another alternate embodiment of the microprocessor memory shown in FIG. 1.

The invention further contemplates another alternate embodiment that stores the content of any Non-Volatile Memory (NVM) in a flash memory for use should the contents of the NVM become corrupted. The NVM typically contains static information such as, for example, data that is programmed into the ECU by the manufacturer at the fabrication facility. A schematic diagram of a microprocessor 10 that includes a NVM 90 memory is shown in FIG. 7 where components that are the same as components shown in FIG. 1 have the same numerical identifiers and the memory 12 is now identified as a Read Only Memory (ROM). As also shown in FIG. 7, the microprocessor is connected by the communication bus 14 to a flash memory 92 that is utilized to back up the NVM 90, as will be described below.

In prior art systems, the NVM 90 is tested during the boot up of the microprocessor and also periodically during operation by running a sum check to determine whether the stored data has become corrupted. Upon detecting corruption of the data stored in the NVM 90, the microprocessor would set an error flag and disable the system. The alternate embodiment of the present invention contemplates storing the data contained in the NVM 90 in the flash memory 92 once the boot test has shown that the data is not corrupted. Then, upon data corruption being detected during subsequent testing of the NVM 90 while the system is being operated, the stored data in the flash memory 92 would be read into the NVM 90, allowing operation of the system to continue.

Figure 8:
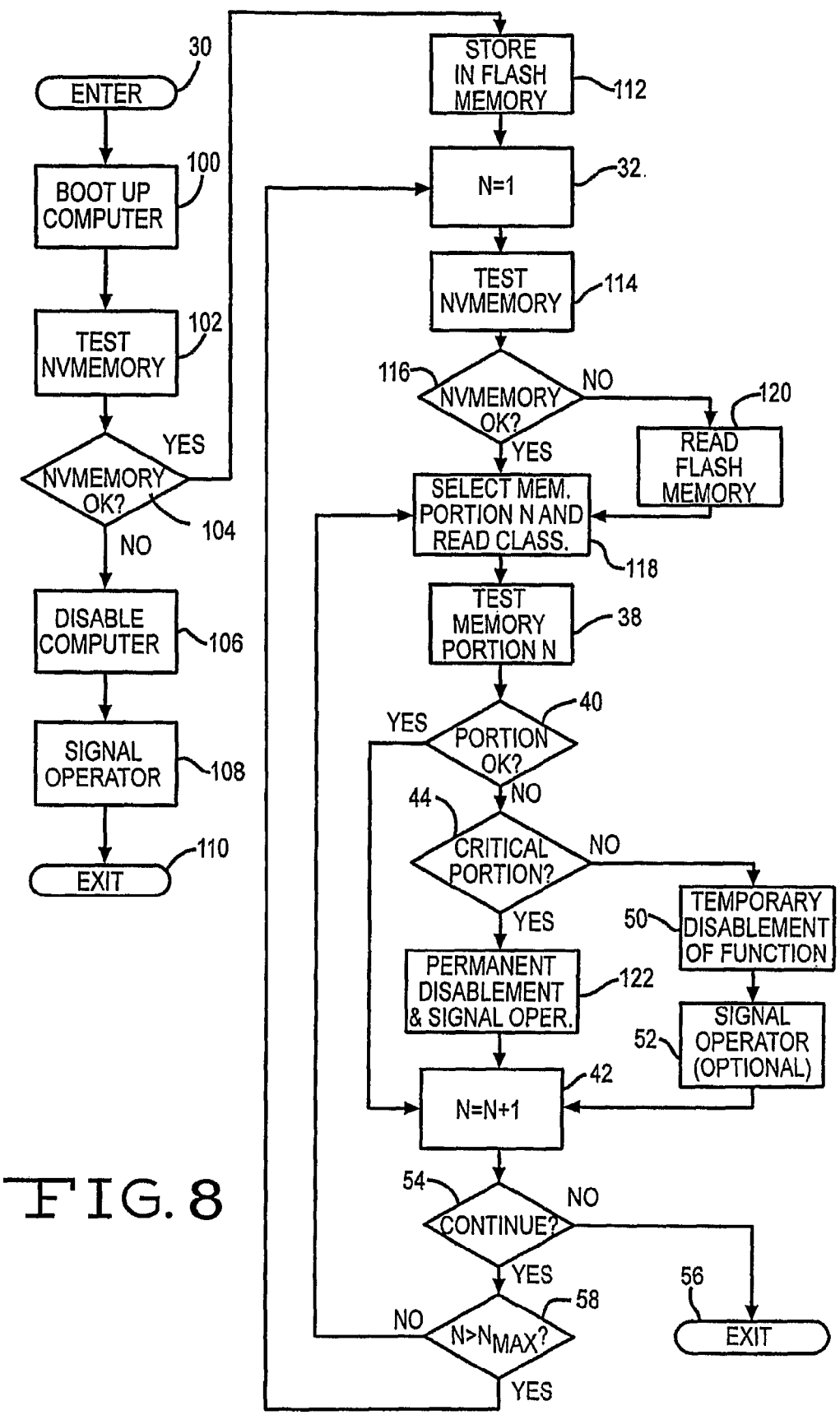
FIG. 8 is another alternate embodiment of the flow chart shown in FIG. 2.

The operation of the alternate embodiment is illustrated by the flow chart shown in FIG. 8, where components that are the same as components shown in FIG. 2 have the same numerical identifiers. The flow chart is entered through block 30 and proceeds to functional block 100 where the microprocessor 10 is booted up. During the boot-up, the NVM 90 is tested in functional block 102 by a conventional method such as, for example, running a checksum of the data contained in the memory. The algorithm then continues to decision block 104.

In decision block 104, it is determined whether the data contained in the NVM 90 has been corrupted. If it is determined that the data in the NVM 90 is corrupted, the algorithm transfers to functional block 106 where the microprocessor and the associated system are disabled. The algorithm then continues to functional block 108 where the vehicle operator is signaled that the system has been disabled by a visual and/or audio signal. The algorithm then exits through block 110. If, in decision block 104, it is determined that the data in the NVM 90 is not corrupted, the algorithm transfers to functional block 112 where the data in the NVM is stored in the flash memory 92.

The algorithm continues to functional block 32 where the memory portion identifier N is set with an initial value of unity, as described above. The algorithm then advances to functional block 114 where the NVM 90 is again tested. The algorithm then continues to decision block 116 where it is determined whether the data contained in the NVM 90 has been corrupted. If it is determined that the data in the NVM 90 is corrupted, the algorithm transfers to functional block 120 where the data stored in the flash memory 92 in functional block 112 is read into the NVM to replace the corrupted data. The algorithm then continues to functional block 118 where the memory portion corresponding to the current memory portion identifier N and the classification of the selected memory portion is read, as described in functional blocks 34 and 36 shown in FIG. 2. If, in decision block 116, it is determined that the data in the NVM 90 is not corrupted, the algorithm transfers directly to functional block 118. From functional block 118, the algorithm proceeds as described above with the exception that the functions shown in 46 and 48 in FIG. 2 are combined into a single functional block 122 in FIG. 8. Thus, the alternate embodiment shown in FIG. 2 periodically checks the NVM 90 and, upon finding corrupted data, replaces the corrupted data with uncorrupted data that was stored in the flash memory 92 during boot-up of the microprocessor 10.

While the alternate embodiment utilizing a flash memory 92 described above was illustrated by a modification of FIG. 2, it will be appreciated that the flash memory also may be utilized with the embodiments of the invention illustrated in FIGS. 3, 5 and 6 (not shown). Such utilization involves modifying the flow charts shown in FIGS. 3, 5 and 6 in a manner similar to the modification of the flow chart shown in FIG. 2 to include the additional blocks shown in FIG. 8. Also, while the embodiment was illustrated in FIG. 8 with both updating of the NVM 90 and checking portions of the ROM 12, it will be appreciated that the invention also may be practiced for updating only the NVM 90 without any checking of the ROM portions (not shown).

Figure 9:
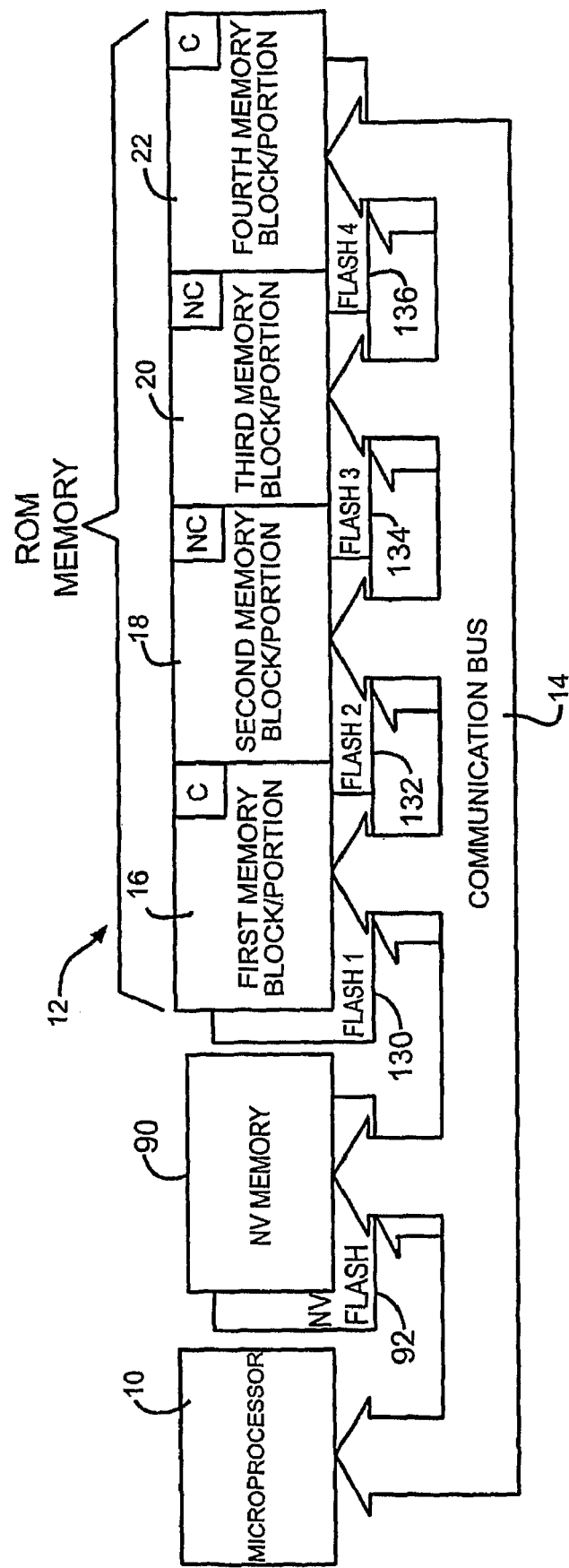
FIG. 9 is a schematic drawing of another alternate embodiment of the microprocessor memory shown in FIG. 1.

Another alternate embodiment of the invention is shown in FIG. 9 where components shown in FIG. 9 that are similar to components shown in FIGS. 1 and 7 have the same numerical identifiers. As shown in FIG. 9, flash memories are also provided as backup for the ROM memory portions 16, 18, 20 and 22. Thus FLASH1 130 is a flash memory provided as back up for the first memory portion 16. Similarly, FLASH2 132 is a flash memory provided as back up for the second memory portion 18, FLASH3 134 is a flash memory provided as back up for the third memory portion 20, and FLASH4 136 is a flash memory provided as back up for the fourth memory portion 22. While separate flash memories 90, 130, 132, 134 and 136 are shown in FIG. 9, it will be appreciated that the invention also may be practiced with a single flash memory (not shown) having portions dedicated to the individual flash memories shown in FIG. 9.

The alternate embodiment contemplates initial testing of each of the memory portions upon initial boot-up of the microcomputer 10 and, upon successful testing, storing the content of the NVM 90 and each of the ROM memory portions 16, 18, 20 and 22 in the corresponding flash memory 92, 130, 132, 134 and 136, respectively. Then, if upon subsequent periodic testing of each of the memory portions, it is determined that the data in one of the memories is corrupted, the uncorrupted data in the corresponding flash memory is copied into the memory portion to replace the corrupted data.

Figure 10A:
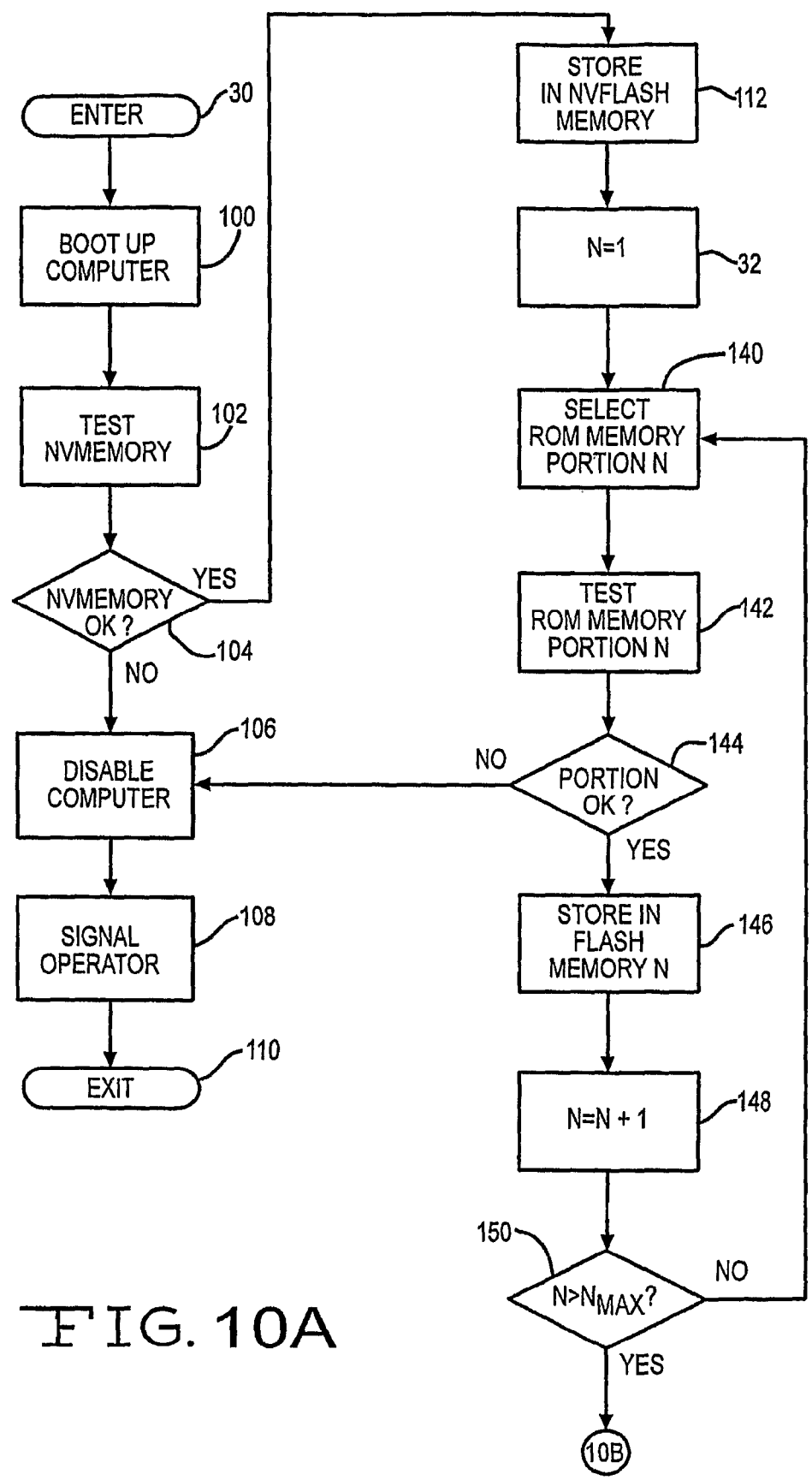
FIG. 10 is another alternate embodiment of the flow chart shown in FIG. 2.
Figure 10B:
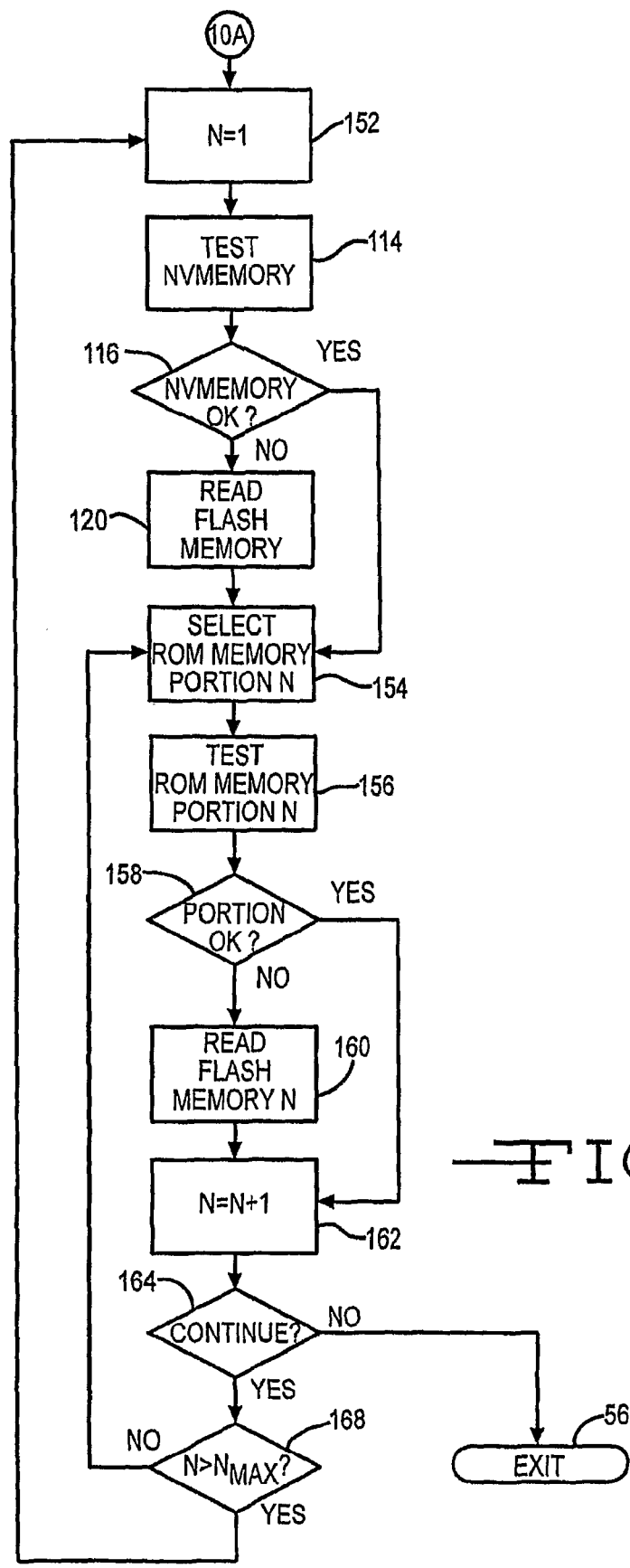

The operation of an algorithm for implementing the alternate embodiment is illustrated by the flow charts shown in FIGS. 10A and 10B where components that are similar to components shown in FIGS. 2 and 8 have the same numerical identifiers. In FIG. 10A, the content of the NVM and ROM memory portions are read into the corresponding flash memories while in FIG. 10B the NVM and ROM memory portions are written over if corrupted data is detected.

In FIG. 10A, the algorithm is entered through block 30 and proceeds as described above through functional block 32 where the ROM memory portion identifier N is initially set to one. The algorithm then advances to functional block 140 where the ROM memory portion corresponding to the current value of the ROM memory portion identifier N is selected. Next, the selected ROM memory portion is tested in functional block 142 after which the algorithm advances to decision block 144. If, in decision block 144, it is determined that the data in the tested ROM memory portion has been corrupted, the algorithm transfers to decision block 106 in which the microprocessor and the associated system are disabled. The algorithm then continues to functional block 108 where the vehicle operator is signaled that the system has been disabled by a visual and/or audio signal. The algorithm then exits through block 110. If, in decision block 144, it is determined that the data in the tested ROM memory portion is not corrupted, the algorithm transfers to functional block 146 where the data in the tested ROM memory portion is stored in the flash memory associated with the tested ROM memory portion. The algorithm then advances to functional block 148 where the ROM memory portion identifier N is indexed by one. The algorithm then advances to decision block 150.

In decision block 150, the current value of the ROM memory portion identifier N is compared to the maximum ROM memory portion identifier $N_{MAX}$. If the ROM memory portion identifier N is less than or equal to the maximum identifier value $N_{MAX}$, all of the ROM memory portions have not been initially tested and the algorithm transfers back to decision block 140 and proceeds as described above. If, in decision block 150, the ROM memory portion identifier is greater than the maximum identifier value $N_{MAX}$, all of the ROM memory portions have been initially tested and the algorithm transfers to FIG. 10B.

In FIG. 10B, the ROM memory portion identifier N is reset to one. The algorithm then advances to functional block 114 where the non-volatile memory is tested and then continues as described above for the flow chart shown in FIG. 8 until functional block 154 is reached. In functional block 154, the ROM memory portion corresponding to the current value of the ROM memory portion identifier N is selected. Next the selected ROM memory portion is tested in functional block 156 after which the algorithm advances to decision block 158. If, in decision block 158, it is determined that the data in the tested ROM memory portion has been corrupted, the algorithm transfers to functional block 160 in where the uncorrupted data stored in the corresponding flash memory is read over the corrupted data in the tested ROM memory portion. The algorithm then continues to functional block 162. If, in decision block 158, it is determined that the data in the tested ROM memory portion is not corrupted, the algorithm transfers to directly to functional block 162.

In functional block 162, the ROM memory portion identifier N is indexed by one. The algorithm then advances to decision block 164. In decision block 164, it is determined whether the algorithm should continue. If the algorithm is not to continue, the algorithm exits through block 56. If, in decision block 164, it is determined that the algorithm should continue, the algorithm transfers to decision block 168.

In decision block 168, the current value of the ROM memory portion identifier N is again compared to the maximum ROM memory portion identifier $N_{MAX}$. If the ROM memory portion identifier N is less than or equal to the maximum identifier value $N_{MAX}$, all of the ROM memory portions have not been tested and the algorithm transfers back to decision block 154 to select the next ROM memory portion for testing and then proceeds as described above. If, in decision block 154, the ROM memory portion identifier is greater than the maximum identifier value $N_{MAX}$, all of the ROM memory portions have been tested and the algorithm transfers to functional block 152 where the ROM memory portion identifier N is again reset to one and the next iteration of memory testing begins.

While the alternate embodiments of the invention shown in FIGS. 7 through 10 illustrate copying the content of either only the non-volatile memory or copying the content of both the non-volatile memory and portions of the ROM memory into the flash memory, it will also be appreciated that invention may be practiced by copying only the portions of the ROM memory into the flash memory (not shown). Additionally, it is contemplated that the invention may be practiced by copying only selected portions of the ROM memory into the flash memory (not shown). The invention also contemplates being practiced as a combination of the embodiments described above, such as, for example copying the uncorrupted data in at least one of the portions of the ROM memory into a corresponding portion of the flash memory during the initial boot-up of the microcomputer. The remaining portions of the ROM memory portions would continue to be tested as described above for FIGS. 1 through 6 (not shown). The copying of the uncorrupted data from at least one portion of the ROM memory into the flash memory also may be combined with copying the data in the non-volatile memory into the flash memory, as described above.

It will be appreciated that the flow charts shown in FIGS. 2, 3, 5, 6, 8 and 10 are exemplary and it will be appreciated that the invention may be practiced with other steps and in other sequences of steps than those shown in FIGS. 2, 3, 5, 6, 8 and 10. Additionally, while the preferred embodiment has been illustrated and described in terms of a vehicle brake control system, it will be appreciated that the invention also may be practiced upon other vehicle control systems that utilize a microcontroller with an associated memory such as, for example, vehicle stability control systems, traction control systems, active suspension control systems and engine control systems. Furthermore, it is contemplated that the invention also may be practiced upon non-vehicle control systems that utilize a microcontroller with an associated memory.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope. For example, it will be appreciated that each of the memory blocks shown in FIG. 1 may be further divided into memory sub-blocks for testing with each of the sub-blocks assigned a classification.

What is claimed is:

1. A method for reconfiguring a memory storage device comprising the steps of:
    (a) providing a single memory storage device that is included in an electronic control system, the memory storage device being divided into separate portions;
    (b) testing each portion of the memory storage device for a fault; and
    (c) upon detecting a fault in step (b), disabling both the portion of the memory storage device associated with the fault and a portion of the control system that is associated with the disabled portion of the memory storage device.

2. The method according to claim 1 wherein the portions of the memory storage device provided in step (a) are each assigned a classification as one of critical and non-critical and further wherein disablement in step (c) is permanent for any disabled portion of the memory storage device that is classified as critical.

3. The method according to claim 1 wherein the portions of the memory storage device provided in step (a) are each assigned a classification as one of critical and non-critical and further wherein disablement in step (c) is temporary for any disabled portion of the memory storage device that is classified as non-critical.

4. The method according to claim 3 wherein the temporary disablement may be subsequently reset upon clearance of the associated fault detected in step (b).

5. The method according to claim 4 wherein the portion of the control system associated with the disabled portion of the memory storage device also is enabled upon clearance of the associated fault detected in step (b).

6. A method for reconfiguring a memory storage device comprising the steps of:
    (a) providing a memory storage device that is divided into separate portions with each portion of the memory storage device assigned a classification as one of critical and non-critical with a back-up memory portion provided for each critical portion of the memory storage device;
    (b) testing each critical portion of the memory storage device for a fault;
    (c) upon detecting a fault in step (b) for a critical portion of the memory storage device, replacing the entire function contained within the faulted portion of the memory storage device associated with information stored in the corresponding back-up memory portion;
    (d) testing each non-critical portion of the memory storage device for a fault; and further
    (e) disabling temporarily any non-critical portion of the memory storage device for which a fault is detected.

7. The method according to claim 6 further including generation of an error signal upon detection of a fault in a critical portion of the memory storage device in step (b).

8. The method according to claim 6 wherein step (e) also includes disabling the operation of the portion of a control system associated with the disabled non-critical portion of the memory storage device.

9. The method according to claim 8 wherein the temporary disablement of the non-critical memory portion of the memory storage device in step (e) may be subsequently reset upon clearance of the associated fault detected in step (d).

10. The method according to claim 9 wherein the memory storage device is included in an electronic brake control system.

11. A method for reconfiguring a memory storage device connected to a microprocessor, the method comprising the steps of:
    (a) providing a microprocessor that is connected to a ROM, the ROM being divided into separate portions with each portion of the ROM assigned a classification as one of critical and non-critical, the microprocessor also connected to a non-volatile memory for storing static data and a flash memory;
    (b) booting up the microprocessor;
    (c) testing the non-volatile memory and, upon determining that the data in the non-volatile memory is not corrupted, copying the static data in the non-volatile memory into the flash memory;
    (d) testing each portion of the ROM for a fault;
    (e) taking a corrective action upon detecting a fault in step (d); and
    (f) testing periodically the non-volatile memory and, upon determining that the data in the non-volatile memory is corrupted, replacing the corrupted static data with the uncorrupted static data stored in the flash memory during step (c).

12. The method according to claim 11 further including in step (a) providing a back-up memory portion for each critical portion and further wherein the corrective action in step (c) includes replacing the entire function contained within a faulted critical portion of the ROM with information stored in the corresponding back-up memory portion.

13. A method for reconfiguring a memory storage device connected to a microprocessor, the method comprising the steps of:
    (a) providing a microprocessor that is connected to a ROM, the ROM being divided into separate portions, the microprocessor also connected to a non-volatile memory for storing static data and a flash memory having a portion corresponding to each portion of the ROM;
    (b) booting up the microprocessor;
    (c) testing each portion of the ROM and, upon determining that the data in tested portion of the ROM is not corrupted, copying the data in the tested portion of the ROM into the portion of the flash memory corresponding to the tested portion of the ROM; and;
    (d) testing periodically each portion of the ROM and, upon determining that the data in the tested portion of the ROM is corrupted, replacing the corrupted data with the uncorrupted data stored in the corresponding portion of the flash memory during step (c).

14. A method for reconfiguring a memory storage device connected to a microprocessor, the method comprising the steps of:
    (a) providing a microprocessor that is connected to a ROM, the ROM being divided into separate portions, the microprocessor also connected to a non-volatile memory for storing static data and a flash memory having a portion corresponding to each portion of the ROM and a portion corresponding to the non-volatile memory;
    (b) booting up the microprocessor;
    (c) testing the non-volatile memory and, upon determining that the data in the non-volatile memory is not corrupted, copying the data in the non-volatile memory into the portion of the flash memory corresponding to the non-volatile memory;
    (d) testing each portion of the ROM and, upon determining that the data in tested portion of the ROM is not corrupted, copying the data in the tested portion of the ROM into the portion of the flash memory corresponding to the tested portion of the ROM;

(e) testing periodically the non-volatile memory and, upon determining that the data in the tested non-volatile memory is corrupted, replacing the corrupted data with the uncorrupted data stored in the corresponding portion of the flash memory during step (c); and (f) testing periodically each portion of the ROM and, upon determining that the data in the tested portion of the ROM is corrupted, replacing the corrupted data with the uncorrupted data stored in the corresponding portion of the flash memory during step (d).

15. A method for reconfiguring a memory storage device connected to a microprocessor, the method comprising the steps of:

(a) providing a microprocessor that is connected to a ROM, the ROM being divided into separate portions with each portion assigned a classification as one of critical and non-critical, the microprocessor also connected to a non-volatile memory for storing static data and a flash memory having a portion corresponding to at least one portion of the ROM and a portion corresponding to the non-volatile memory;

(b) booting up the microprocessor;

(c) testing the non-volatile memory and, upon determining that the data in the non-volatile memory is not corrupted, copying the data in the non-volatile memory into the flash memory;

(d) testing the at least one portion of the ROM and, upon determining that the data in tested portion of the ROM is not corrupted, copying the data in the tested portion of the ROM into the portion of the flash memory corresponding to the tested portion of the ROM; and (e) testing periodically the non-volatile memory and, upon determining that the data in the tested memory is corrupted, replacing the corrupted data with the uncorrupted data stored in the corresponding portion of the flash memory during step (c);

(f) testing periodically the at least one portion of the ROM and, upon determining that the data in the tested ROM portion is corrupted, replacing the corrupted data with the uncorrupted data stored in the corresponding portion of the flash memory during step (d);

(g) testing periodically the portions of the ROM that do not have data copied into the flash memory for faults; and (h) taking a corrective action upon detecting a fault in step (g).

16. A method for reconfiguring a memory storage device connected to a microprocessor, the method comprising the steps of:

(a) providing a microprocessor that is connected to a ROM, the ROM being divided into separate portions with each portion assigned a classification as one of critical and non-critical, the microprocessor also connected to a non-volatile memory for storing static data and a flash memory having a portion corresponding to at least one portion of the ROM and a portion corresponding to the non-volatile memory;

(b) booting up the microprocessor;

(c) testing the at least one portion of the ROM and, upon determining that the data in tested portion of the ROM is not corrupted, copying the data in the tested portion of the ROM into the portion of the flash memory corresponding to the tested portion of the ROM; and (d) testing periodically the non-volatile memory and the at least one portion of the ROM and, upon determining that the data in the tested portion of the ROM is corrupted, replacing the corrupted data with the uncorrupted data stored in the corresponding portion of the flash memory during step (c)

(e) testing periodically the portions of the ROM that do not have data copied into the flash memory for faults; and (f) taking a corrective action upon detecting a fault in step (e).

* * * * *